(12) United States Patent
Dreps et al.

(10) Patent No.: US 6,762,626 B1
(45) Date of Patent: Jul. 13, 2004

(54) PHASE DETECTOR (75) Inventors: Daniel Mark Dreps, Georgetown, TX (US); Frank David Ferraiolo, Essex Junction, VT (US); Kevin Charles Gower, LaGrangeville, NY (US); Gary Alan Peterson, Rochester, MN (US); Robert James Reese, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/422,686

(22) Filed: Apr. 24, 2003

(51) Int. Cl.[7] .................................................. H03D 9/00
(52) U.S. Cl. ................................................ 327/2; 327/3
(58) Field of Search ............................. 327/2, 3, 8, 7, 327/12, 9, 10

(56) References Cited

U.S. PATENT DOCUMENTS 5,712,580 A * 1/1998 Baumgartner et al. ........ 327/12
6,177,812 B1 * 1/2001 Nagao et al. .................. 327/7

* cited by examiner

Primary Examiner—Linh M. Nguyen
(74) Attorney, Agent, or Firm—Barry S. Newberger; Winstead Sechrest & Minick P.C.; Mark E. McBurney (57) ABSTRACT

A phase detector for use in conjunction with a delay locked loop is provided. Programmable delay elements insert an adjustable delay in a received data stream. The programmable delays stress the setup and hold times of the incoming data. Phase detector sampling logic detects the phase difference between a nominal center of the data window, and the limits on the setup (early) edge of the data value window, and the hold time limit (late time) edge of the data valid window ("guardbands"). A data signal arriving earlier than an early guardband or later than a late guardband may not be correctly sampled, and a guardband failure may be said to have occurred. A state machine detects such guardband errors and provides corrective feedback signals.

25 Claims, 5 Drawing Sheets

PHASE DETECTOR

TECHNICAL FIELD

The present invention relates to digital communication links, and in particular, to a phase detector for providing a mechanism to sense, the phase between the data and the communication link clock signal associated therewith, and most particularly to a phase detector for sensing the dynamic data valid window of the communication link.

BACKGROUND INFORMATION

To maximize the bandwidth of an interface or a communication link, data is commonly transmitted in a non-return to zero (NRZ) format. NRZ formatted data only changes logical state when the data changes state. Data is not required to change states on every clock cycle. Consequently, there can be long runs of data without any transitions on the data. Noise, clock jitter and bandwidth limited transmission media can corrupt the data signal transitions.

Figure 1:
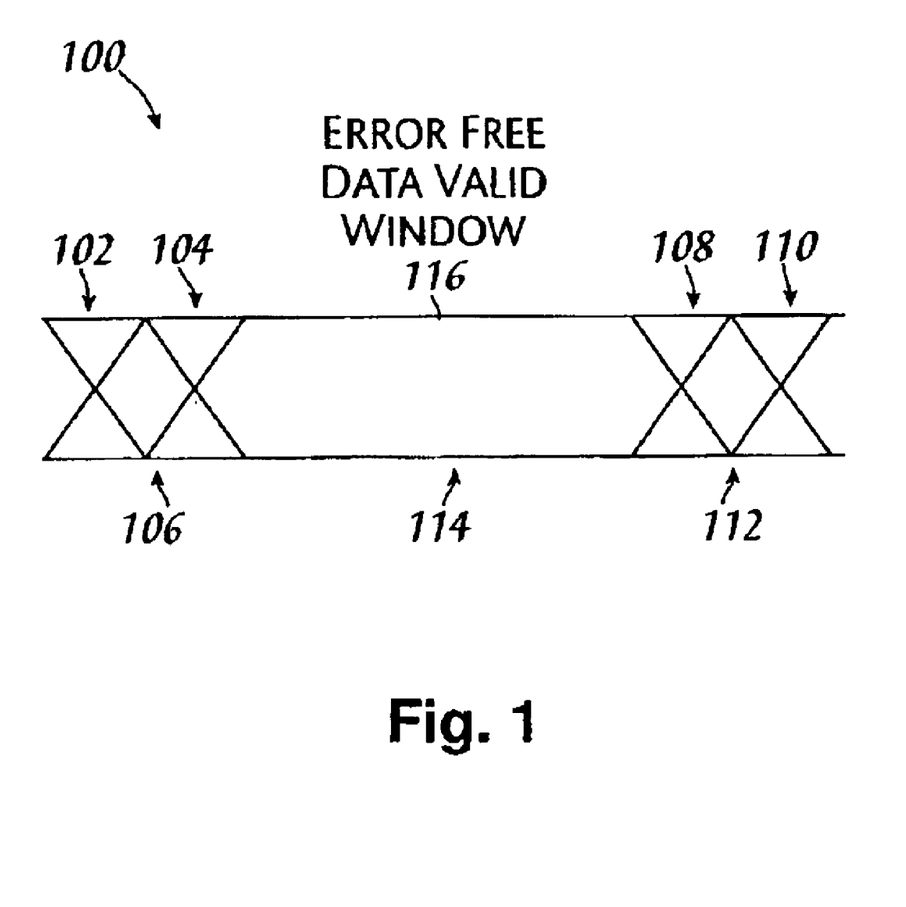
FIG. 1 schematically illustrates an "eye" diagram depicting the effect noise, clock jitter, etc., in a data link.

Typically, the data communicated across the interface or communication link (according to the particular data environment) is captured in the receiving domain using a clock that is synchronous with the transmitting clock. That is, the clock has the same clock rate (baud rate) as the clock in the sending domain. It is desirable to sample the data in the middle of the clock interval. Even if the clock in the receiving domain is phase synchronous with the clock in the sending domain (including accounting for path delays) noise, clock jitter and transmission media affects, as noted herein above, can introduce random, time dependent, skews in the data transmissions relative to the clock in the receiving domain. This is illustrated in FIG. 1 which schematically depicts an "eye" diagram as may be used in conjunction with the inventive principles described hereinbelow. Empirically, an eye diagram may be generated for a particular interface or communication link by superimposing multiple random data transitions on top of each other. In FIG. 1, an exemplary eye diagram 100 is shown. Transitions 102 and 104 represent the lower and upper bounds of the setup time error, respectively. The average of these is the average early setup time 106. Similarly, transitions 108 and 110 represent the lower bound hold time error and the upper bound hold time error, respectively. The average late hold time 112 is the mean of these bounds. The center of the eye is functional data 114, the ideal sample point within the error free data valid window 116.

A phase detector may be used in conjunction with a phase locked loop (PLL) or a delay locked loop (DLL) to control the sampling of the data in the receiving domain. The phase detector is used to acquire the phase relationship between the receiving clock and the data. The phase detector output is typically filtered and fed back to control circuits to adjust the phase of the sampling clock, or the data, to reduce the phase error between the two, that is, to optimize the functional data sample point to the center of the data valid region.

Phase detectors typically average the transitions on the data relative to the sampling clock. Analog phase detectors commonly employ a capacitor to hold and accumulate charge proportional to the phase difference between the clock and the data. However, high precision capacitors are difficult to manufacture and must be constantly charged and discharged to function properly. Digital phase detection schemes commonly count edges as a mechanism for averaging the phase detector outputs. However, to average over long periods of time, digital counters must be made large, which dissipates power and consumes area on a chip. Additionally, as discussed hereinabove, NRZ signals may have runs of data without a transition. Therefore, edge counting systems may accumulate significant phase errors before the error is detected.

Consequently, there is a need in the art for a phase detector that has reduced power consumption and reduced sensitivity to NRZ format data. Additionally, there is a need in the art for a phase detector that mitigates these effects without the use of capacitors to average the transitions on the data relative to the sampling clock.

SUMMARY OF THE INVENTION

The aforementioned needs are addressed by the present invention. In one embodiment, a phase detector apparatus is provided. The apparatus includes at least one of a first storage unit operable for sampling a first data stream in response to a first clock, and a second storage unit operable for sampling a second data stream in response to a second clock. The second data stream comprises a delayed data stream derived from said first data stream. The apparatus also contains a third storage unit operable for sampling said first data stream in response to said second clock. The first clock comprises a delayed clock derived from said second clock. The apparatus further includes at least one of a first comparison logic and a second comparison logic.

The first comparison logic is operable for receiving a sampled clock signal from said first storage unit and sampled data from said third storage unit. An output of said first comparison logic has a first logic state if said sampled clock data from said first storage unit and sampled data from said third storage unit compare. The output of the first comparison logic has a second logic state if sampled clock signal from said first storage unit and sampled data from said second storage unit miscompare.

The second comparison logic is operable for receiving sampled data from said second storage unit and sampled data from said third storage unit. An output of said second comparison logic has a first logic state if said sampled data from said second storage unit and sampled data from said third storage unit compare. The output has second logic state if sampled data from said second storage unit and sampled data from said third storage unit miscompare.

The foregoing has outlined rather broadly the features and technical advantages of one or more embodiments of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

A phase detector for use in conjunction with a delay locked loop is provided. Programmable delay elements insert an adjustable delay in a received data stream. The programmable delays stress the setup and hold times of the incoming data. Phase detector sampling logic detects the phase difference between a nominal center of the data window, and the limits on the setup (early) edge of the data value window, and the hold time limit (late time) edge of the data valid window. The phase interval between the early time edge of the data valid window may be referred to as the early guardband and the phase interval between the nominal center of the data valid window and the late edge of the data valid window may be referred to as the late guard band; collectively the early and late guardbands may simply be referred to as guardbands, if the context does not require distinguishing between the early and late guardbands. A data signal arriving earlier than the early guard band or later than the late guard band may not be correctly sampled, and a guardband failure may be said to have occurred. A state machine coupled to the phase detector sampling logic, detects such guardband errors and provides a corrective feedback signal in the delay locked loop to maintain centering of the data signal in the sampling window. Additionally, the phase detector dynamically adjusts the guardbands in response to setup and hold time errors.

In the following description, numerous specific details are set forth such as specific time intervals or sampling rates to provide a thorough understanding of the present invention. However, it will be apparent to those skilled in the art that the present invention may be practiced without such specific details. In other instances, well-known circuits have been shown in block diagram form in order not to obscure the present invention in unnecessary detail. For the most part, details considering timing considerations and the like have been omitted in as much as such details are not necessary to obtain a complete understanding of the present invention and are within the skills of persons of ordinary skill in the relevant art.

Figure 2:
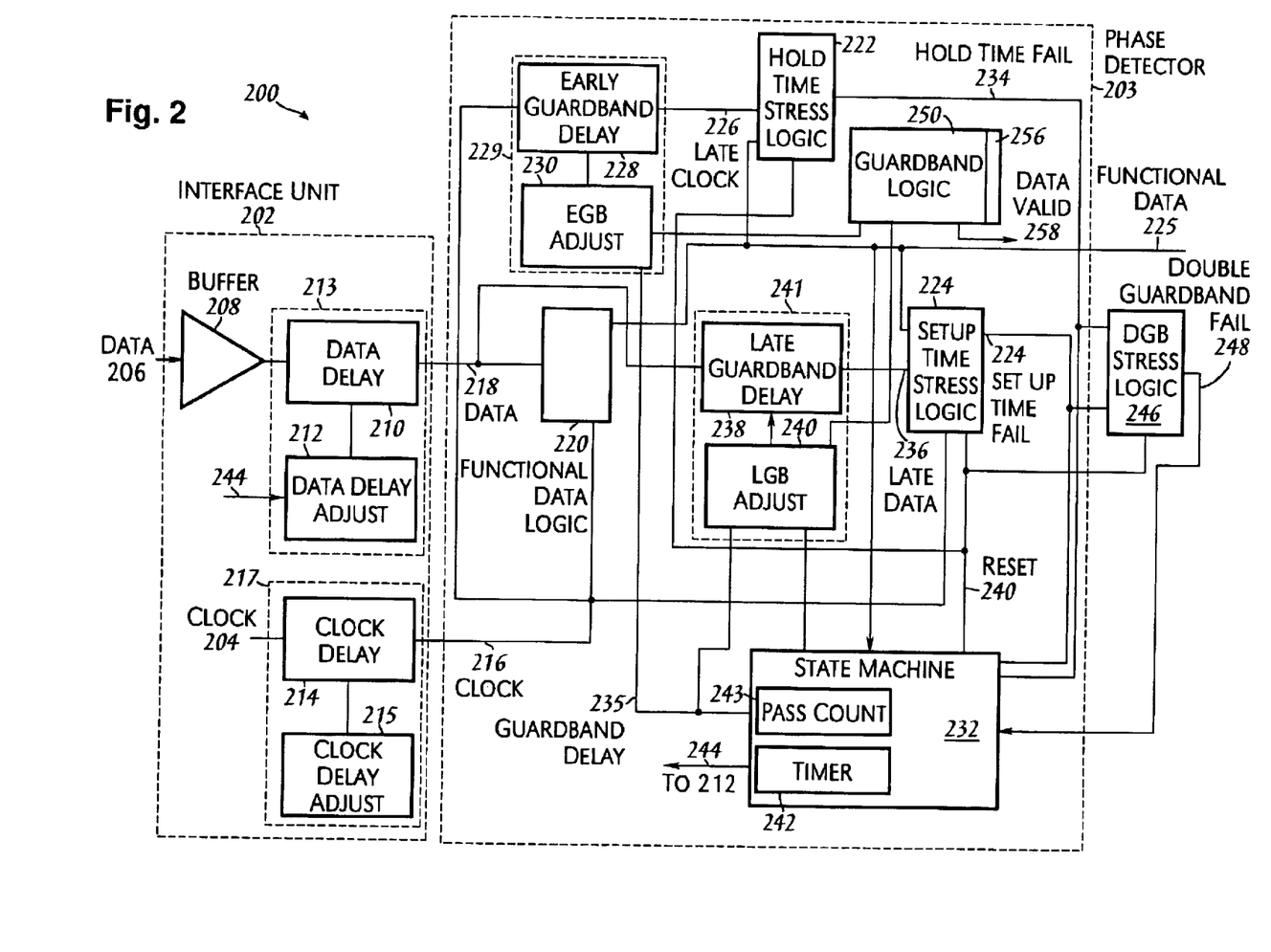
FIG. 2 illustrates, in a high level block diagram form, an interface apparatus in accordance with the principles of the present invention.

Refer now to the drawings wherein depicted elements are not necessarily shown to scale and wherein like or similar elements are designated by the same reference numeral through the several views. FIG. 2 illustrates a high level block diagram of an interface/communication link apparatus 200 in accordance with the present inventive principles. Apparatus 200 includes an interface unit 202 and a phase detector 203. Interface unit 202 may be used to deskew the clock in the receiving domain (such as clock 204) and the data received (such as data 206). Interface unit 202 includes a buffer 208, a data unit 210 which receives the output from buffer 208 and a corresponding data delay adjust 212. (Collectively, data delay 210 and data delay adjust 212 may be referred to for simplicity, as a data delay unit 213.) Similarly, clock 204 is input to a clock delay 214 having a corresponding clock delay adjust 215. (Collectively, clock delay 214 and clock delay adjust may be referred to as data delay unit 217.) Note that data 206 may be, in general, n bits wide, in which case it wold be recognized by those of ordinary skill in the art that each of the elements within the interface unit 202 would be n units deep. In other words, interface unit 202 may independently deskew each of the n bits of data 206. An elastic interface which may be used in conjunction with apparatus 200 has been described in the commonly owned U.S. Pat. No. 6,334,163, entitled "Elastic Interface Apparatus and Method Therefor" and, in the commonly owned, co-pending U.S. patent application Ser. No. 09/961,506 also entitled "Elastic Interface Apparatus and Method Therefor." The aforementioned U.S. Pat. No. 6,334,163 and U.S. patent application Ser. No. 09/263,662 are hereby incorporated herein by reference. Additionally, data deskew mechanism and a clock deskew mechanism which may be used in conjunction with interface unit 202 is described in the commonly owned co-pending U.S. patent application, Ser. No. 09/263,662 entitled "Dynamic Wave-Pipelined Interface Apparatus and Methods Therefor," which is also hereby incorporated herein by reference. The deskewed clock, clock 216 and deskewed data, data 218 output from interface unit 202 are input to phase detector 203.

Phase detector 203 includes functional data logic 220, hold time stress logic 222 and setup time stress logic 224. Functional data logic 220, hold time stress logic 222 and set up time stress logic 224, constitute portions of phase detector incorporating the present inventive principles. These will be described in further detail in conjunction with FIG. 3, below. Functional data logic unit 220 outputs functional data 225. Functional data 225 represents the output data from interface/communications link apparatus 200. Functional data 225 may be provided to additional circuitry (not shown) within a receiving domain for further processing in conjunction with the particular application of the receiving system.

Additionally, data 218 is input to hold time stress logic 222 which also receives late clock 226. Late clock 226 is produced by delaying clock 216 in early guardband delay 228. Early guardband delay 228 is a programmable, or alternatively, adjustable delay device. The amount of delay introduced in clock 216 to generate late clock 226 is controlled via EGB adjust 230. (Collectively, early guardband delay 228 and EGB adjust 230 may be referred to as EGB delay unit 229.) EGB adjust 230 is controlled via state machine 232 guardband delay output 235. The operation of state machine 232 will be discussed hereinbelow in conjunction with FIG. 4. A programmable delay device that may be used in an embodiment of guardband loop 203 is described in the commonly owned U.S. Pat. No. 6,421,784 of Chu et al. entitled "Programmable Delay Circuit Having a Fine Delay Element Selectively Receives Input Signal and Output Signal of Coarse Delay Element," hereby incorporated herein by reference.

Hold time stress logic 222 includes logic for comparing late clock 226 and data 225 and outputs hold time stress 234 in response thereto. This is effected in an embodiment of the present invention using the sample and compare logic of FIG. 3, described below, by using late clock 226 to sample the functional data 225 which is then compared with the functional data. By delaying the sampling clock used to latch the data, the data is effectively sampled later in the data window for the hold time stress. Hold time stress is input to state machine 232. Under the control of state machine 232, phase detector 203, via hold time stress logic 222 and early guardband delay unit 229 generates a measure of the width of the early guardband.

Setup time stress logic 224 receives late data 236. Late data 236 is output by late guardband delay 238. Late guardband delay 238 may also be a programmable delay device similar to early guardband delay 228. Late guardband delay 238 is controlled via LGB adjust 240. (Collectively, late guardband delay.238 and LGB adjust 240 may be referred to as LGB delay unit 241.) LBJ adjust 240 is also controlled by state machine 232 via guardband delay output 235. Late data 236 represents data 218 delayed by the adjustable delay through late guardband delay unit 238. Setup time stress logic 224 compares the transition of late data 236 with transitions of clock 216. Setup time stress logic 224 in conjunction with late guardband delay unit 238 in state machine 232 generates a measure of the width of the late guardband. Setup time stress logic 224 compares the transition of late data 236 with transitions of clock 216. Similar to the hold time stress logic this is effected in an embodiment of the present invention using the sample and compare logic of FIG. 3. described below, by latching the late data 236 using clock 216 to latch late data 236 which is then compared with the functional data. By delaying the data and sampling with the clock used for functional data sampling, the data is effectively sampled earlier in the data window for the setup times stress. Setup times stress logic 224 in conjunction with late guardband delay unit 238 in state machine 232 generates a measure of the width of the late guardband.

This may be used to derive a measure of performance of the interface/communication link. For example, the minimum value of the guardband width may be stored during operation. (The guardband width is measured by the difference in the late and early time guardband delays.) This provides a measure of the minimum "quality" of the communication link over time. Additionally, a data valid threshold may be programmed and the current guardband value may be compared against the threshold to bound operation, or to ensure a preselected quality of operation of the link. Note that such embodiment of the present invention may run "open loop" in the sense that the data and clock delays, for example, the feedback of adjustments of data delay 210 and clock delay 214 may be omitted.

Thus phase detector 203 may include guardband logic 250 which receives an early guardband signal 252 and a late guardband signal 254 from EGB adjust 230 and LGB 240, respectively. These signals may be a representation of the respective delay values in accordance with a particular embodiment of early guardband delay unit 229 and late guardband delay unit 241, such as the binary control words in an embodiment of a phase detector 203 in which the early guardband delay unit 229 and the late guardband delay unit 241 are implemented in accordance with the aforementioned U.S. Pat. No. 6,421,784, of Chu, et al. Guardband logic 250 outputs a value measuring the guardband width, which may be derived from the difference of late guardband signal 254 and early guardband signal 252. Additionally, guardband logic 250 may include a programmable threshold register 256 for holding a preselected data valid threshold. A data valid flag 258 may be asserted if the guardband width is equal to or exceeds the data valid threshold.

Additionally, the occurrence of a hold time failure and setup time failure on a same data beat (double guardband failure) is detected by double guardband stress logic 246. If a double guardband failure occurs, double guardband fail 248 may be asserted. This will be discussed further in conjunction with FIGS. 3 and 4 below.

Figure 3:
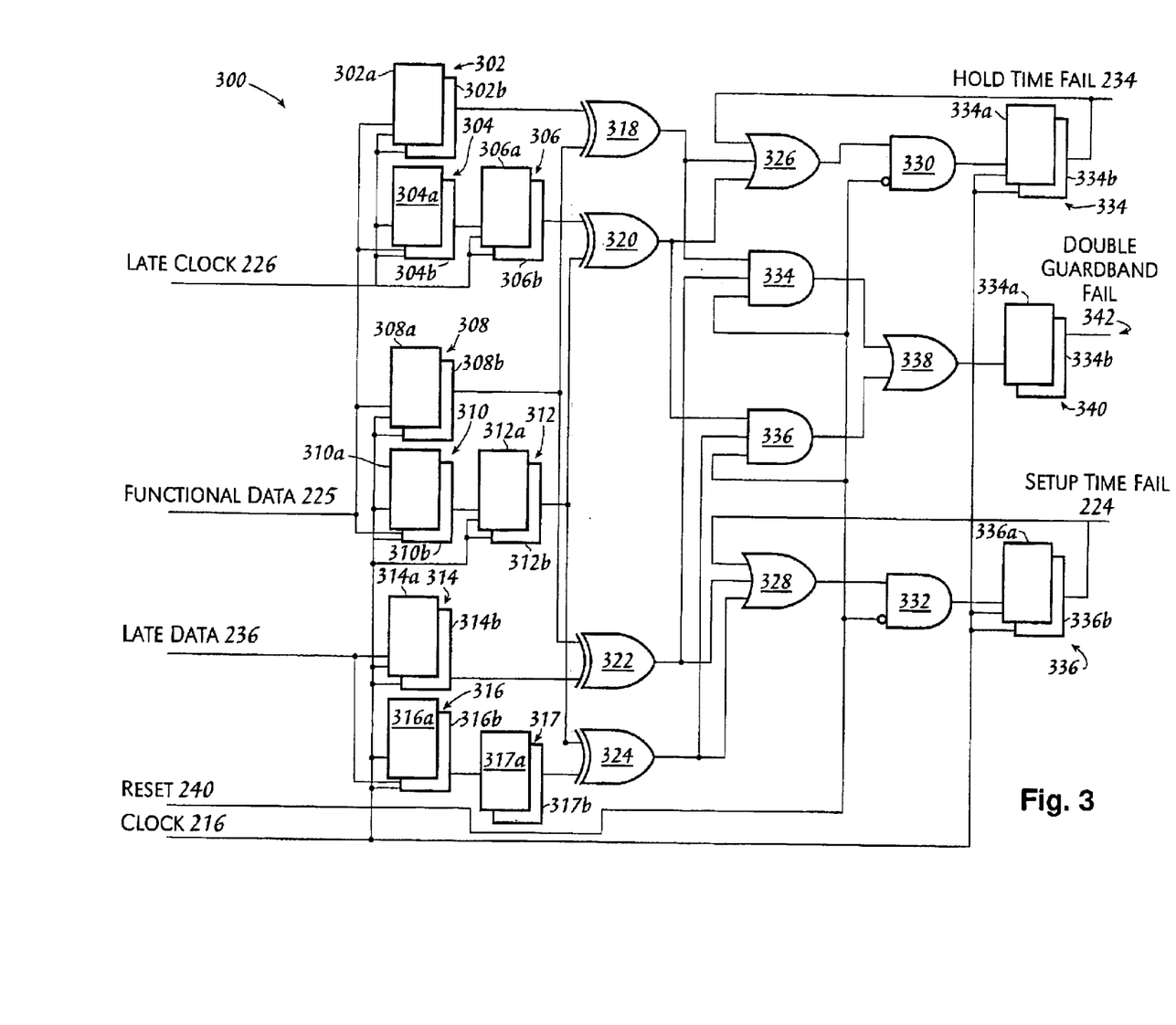
FIG. 3 illustrates, in partial schematic form, a phase detector in accordance with the principles of the present invention, and sampling logic which may be used in conjunction with the interface apparatus of FIG. 2.

Refer now to FIG. 3, illustrating, in partial schematic form, sample and compare logic 300 which may be used in an embodiment of the hold time stress logic and setup time stress logic of a phase detector in accordance with the present inventive principles, such as hold time stress logic 222 and setup time stress logic 224 and double guardband stress logic 246, FIG. 2.

To derive the hold time stress, the functional data is latched into three flips flops 302, 304 and 306 comprised of L1/L2 latch pairs. Flip-flop 302 includes L1 latch 302a and L2 latch 302b which are cascaded (the internal connection of the output of latch 302a and in the input of latch 302b is not shown). (Note that for notational consistency, reference numerals associated with and an L1 latch will use the suffix "a" throughout and likewise reference numerals associated with the L2 latch will use the suffix "b" throughout FIG. 3.) Functional data is input to flip-flop 302 which is clocked by late clock 226. Note that the L1 latch of L1/L2 pairs is active on the high (or logic "1") phase of the clock and the L2 latch of an L1 and L2 latch pair is active on the low (or logic "0") phase of the clock signal.

Sample and compare logic 300 may be used with a double data rate (DDR) interface. Flip-flop 304 effects the sampling of the data active on the negative edge of a DDR clock. Note that the functional data is input into the L2 latch of flip-flop 304, and the L1 latch may not be used. Thus, flip-flop 304 acts as a transparent latch with the data active on the low phase of the DDR clock falling through to the output of latch 304b and being held during the high phase of the DDR clock. Note that because the clock is delayed, the data in L2 latch 304b of flip-flop 304 does not remain valid over a full cycle. Flip-flop 306 puts the data sampled via late clock 226 back onto a cycle boundary.

Similarly, functional data is sampled using flip-flops 308, 310 and 312. In analogous fashion to flip-flops 302, 304 and 306, flip-flops 308, 310 and 312 include an L1/L2 latch pair, respectively, 308a/308b, 310a/310b and 312a/312b. Flip-flops 308, 310 and 312 are clocked by the receiving domain clock 216. Flip-flop 310 and flip-flop 312 accommodate DDR data in similar fashion to flip-flops 304 and 306. Note also that L1 latch 310a in flip-flop 310 may be inactive similarly to L1 latch 304a in flip-flop 304.

Late data 236 is sampled via flip-flops 314, 316 and 317. Flip-flops 425, 426 and 317 include L1/L2, pairs 314a/314b and 317a/317b, respectively. The late data is also sampled with clock 216. Flip-flops 316 and 317 accommodate DDR data, and similar to flip-flops 304 and 310, late data 236 is input into L2 latch 316b of flip-flop 316 and the L1 latch may not be used.

Two-input exclusive OR (XOR) gates are used to compare samples of the functional data to the setup and hold stress samples. XOR 318 compares the functional data and the hold stress samples for data sampled on the positive-going edges of the DDR clock, and XOR 320 provides a similar functionality for the data sampled on negative going clock edges. XOR 322 compares the functional data and the setup time stress samples for data sampled on positive edges of the DDR clock and XOR 324 compares the functional data and the setup stress samples for data sampled on the negative-going DDR clock edges.

Three-input OR gate 326 and 328, two-input AND gates 330 and 332, and flip-flops 334 and 336 are used to hold accumulated comparisons. Note that one input to AND gates 330 and 332 is provided by reset 240. The reset inputs to AND gates 330 and 332 are inverting, and an active "high" reset (output by state machine 232, FIG. 2) to reset the phase detector between samples, drives the output of AND gates 330 and 332 "low" consistent with an embodiment of phase detector logic 330 having active "high" outputs. That is, the hold time stress output and setup time stress outputs are active "high" if a corresponding one or both, of the hold time or setup time failure occurs.

Three-input AND gates 334 and 336, OR gate 338 and flip-flop 340 are used to detect and hold a double guardband failure. Double guardband failure 262 is also active "high"

if both a hold time stress failure and a setup time stress failure occur in the same cycle. Double guardband failure 262 is also an input to state machine 232, FIG. 2.

Figure 4A:
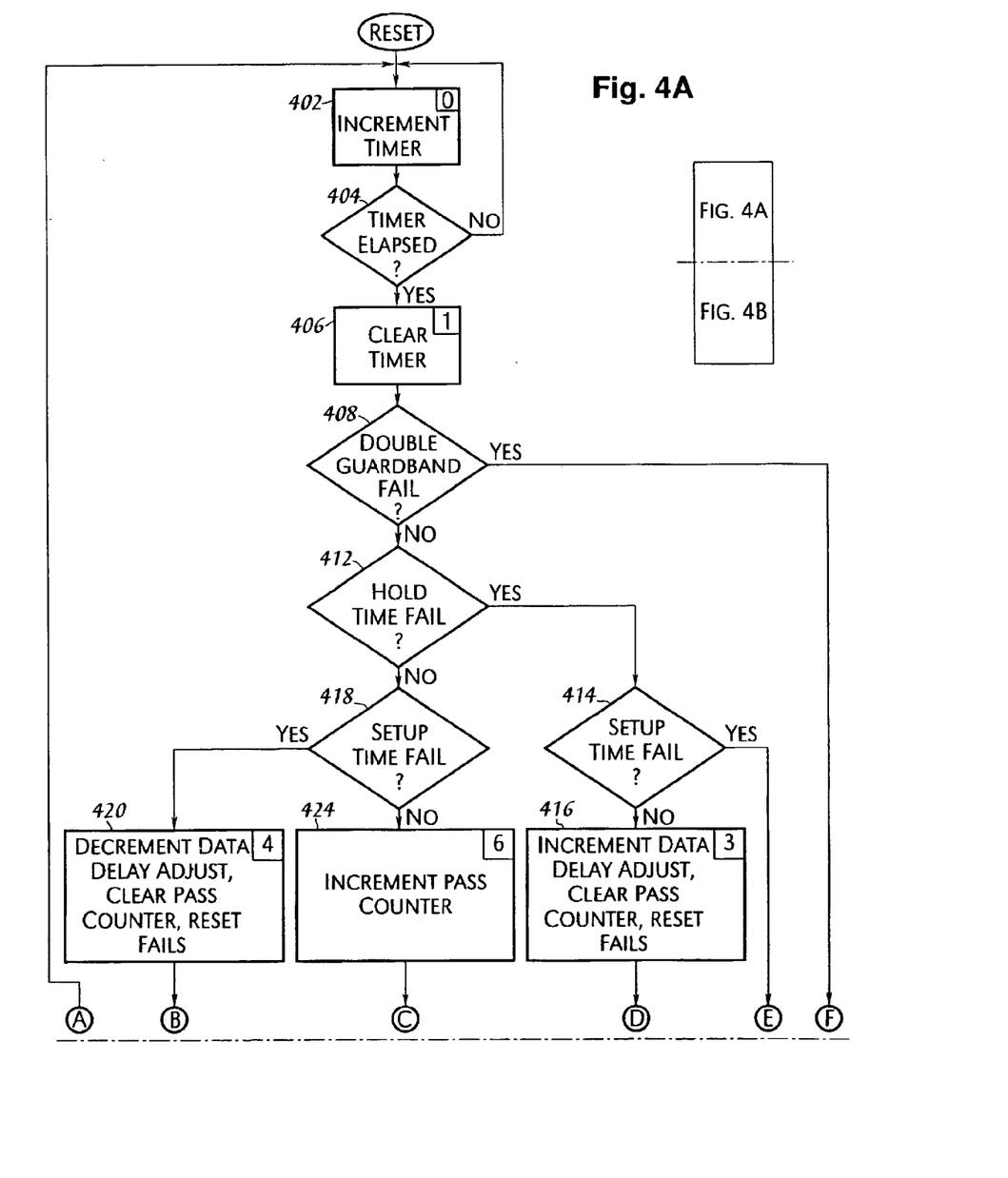
FIG. 4 illustrates a state diagram of a state machine which may be used in conjunction with a phase detector according to the present invention principles.
Figure 4B:
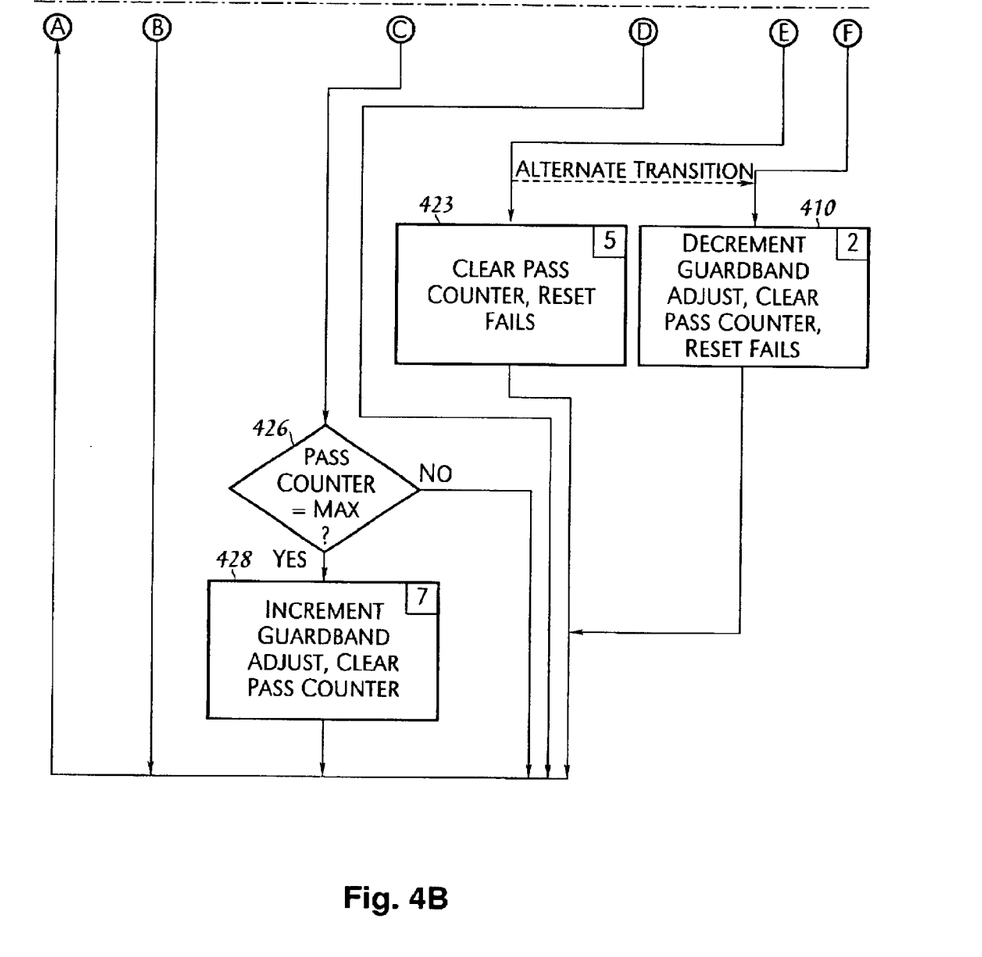

The operation of a phase detector in accordance with the present inventive principles may be further understood by considering the operation of state machine 232, FIG. 2. FIG. 4, illustrates a state diagram for state machine 232, FIG. 2 in accordance with an embodiment of the present invention. State machine 232 samples the hold time stress, setup time stress and double guardband failure signals (illustrated by hold time stress 224, setup time stress 236 and double guardband failure 242 in FIGS. 2 and 3) at preselected intervals. State machine 232, FIG. 2, is depicted as including timer 242, however persons of ordinary skill in the art would recognize that any general purpose timer may be used to provide the sampling intervals and may alternatively be implemented external to the state machine, or even external to apparatus 200. Additionally, it would be recognized that the timer may be programmable to select the sampling interval. In response to the sampled hold time stress, setup time stress and double guardband failure signals, the state machine may adjust the early and late guardband delays (via EGB and LGB adjusts 230 and 240 in the embodiment of FIG. 2) and/or the data and clock delays (via data delay adjust 212 and clock delay adjust 215 in the embodiment of FIG. 2).

FIG. 4 illustrates a conceptual level flow diagram of a state machine in accordance with the present inventive principles. An actual hardware implementation may take alternative forms which would be apparent to those of ordinary skill in the art. The state machine in accordance with the present invention controls the updating of the guardband and functional data sampling points for each bit on a bus, executing these updates periodically, as conceptually indicated by a "timer" mechanism in the machine. In a hardware implementation, this timer/update initiating mechanism could be a separate time or event-related device in another part of the entire bus system.

In State 0, a timer is incremented, block 402. This timer controls how often guardband fail logic is checked for accumulated fails. The time interval may be programmable, and may be any selected interval. An exemplary sample interval may be one thousand clock cycles, however, the present inventive principles are applicable with other sample interval values, and it would be recognized by those of ordinary skill in the art that such embodiments would fall within the spirit and scope of the present invention. When the time has elapsed, in block 404, the machine transitions from State 0 to State 1, and the timer is cleared in State 1, block 406.

In State 1, the setup, hold, and double guardband fails are examined for each bit on the bus. In block 408, a determination is made whether a double guardband failure has occurred, that is, both a hold time and a setup time fail have occurred simultaneously on some bit on the bus. A double guardband failure indicates that the guardband is too wide. If, in block 408, a double guardband fail has occurred, the state machine transitions from State 1 to State 2 and decrements the guardband adjust, decreasing both the early and the late guardband delay, block 410. This may be effected in a phase detector embodiment 203, FIG. 2 via guardband delay 235. A pass counter is cleared and setup and hold fails are reset, for example by reset 240, FIG. 3, and the state machine returns to block 402.

If no double guardband fail occurs, but a hold time fail does occur, with no setup time fail, this indicates that data is being sampled later than the ideal sample point centered in the data window. In block 412, a determination is made whether a hold time fail has occurred. If so, and, assuming for present discussion that no setup time failure has occurred in block 414, the state machine transitions from State 1 to State 3 and increments, in block 416, the data delay adjust counter, thereby delaying the data such that it is sampled closer to the point centered in the data window.

If neither a double guardband fail nor a hold time fail occurs, but a setup time fail occurs, block 418, this indicates that the data is being sampled earlier than the sample point centered in the data window. The state machine transitions from State 1 to State 4 and, in block 420, decrements the data delay adjust counter, thereby speeding up the data such that it is sampled closer to the point centered in the data window. The pass counter is cleared and setup and hold fails are reset, and the state machine returns to block 402.

Returning to block 414, if no double guardband fail occurred, but both a hold time failure (block 412) and setup time failure occur, block 414, a setup time fail and a hold time fail have occurred on a bit during the timer period, but not simultaneously on the same data beat on the bus. In this case, two possible state transitions may be made. In one embodiment, the state machine transitions from State 1 to State 5, block 420, and makes no adjustment of any data delay or guardband values. This has the effect of ignoring these fails, on the assumption that the fails are an unusual noise event that should be ignored. The pass counter is cleared and setup and hold fails are reset, and the state machine returns to block 402.

In an alternative embodiment, labeled "alternative transition" and indicated by the dotted line n FIG. 4, is from State 1 to State 2, which treats this non-simultaneous setup and hold time fail identically to the double guardband fail described above.

If no fail has occurred, this indicates that the sampling point is suitably centered in the data window, and the state machine transitions from State 1 to State 6, block 424, where the pass counter is incremented. This pass counter is then checked while in State 6, in block 426, and if it has reached a preselected maximum value, indicating that a selected number of timer/guardband update cycles has occurred without any guardband fail, then the state machine transitions from State 6 to State 7, block 428. Note that the pass count may be programmed in an embodiment of the present invention. Conversely, if the pass counter has not reached the maximum value, the state machine returns to block 402. In an embodiment of a state machine such as state machine 232, FIG. 2, the maximum value may be stored in pass count register 242. However, the principles of the present invention are not implicated in the location of a register for storing the programmable maximum pass count value, and alternative locations would fall within the spirit and scope of the present invention.

Being in State 7 indicates that the guardband delays arc set so low that the early, late, and normal samples in the data window are so close in time that they always sample the same data. Therefore, in State 7, the guardband delay adjust value is incremented. This moves these three data sampling points further apart, with the hold-time and setup-time sampling occurring closer to the edge of the data eye. The pass counter is also reset.

The operation of this state machine can be viewed as a feedback based controller:

If data is being sampled too late, as indicated by the hold-time fail, then the data is delayed slightly more with respect to the sampling clock in order to better center the sample.

If data is being sampled too early, as indicated by the set-up time fail, then the data is delayed slightly less with respect to the sampling clock in order to better center the sample. If both the setup and hold fails occur, this indicates that these early and late sample points are both outside the data window, and, to properly center the normal sample point for the functional data, these data window edges are found by decreasing the guardband delay, thereby moving early and late sampling points closer to the functional sample point, and thereby to points within, or closer to being within, the data eye. If neither setup nor hold fails occur, this indicates that these early and late sample points are both inside the data window, and, in order to center the normal sample point for the functional data, these data window edges must be found by increasing the guardband delay, thereby moving the early and late sampling points further from the functional sample point, and closer to the edge, or possibly outside the edge of the data eye.

This combination of incrementing and decrementing the data delay in response to setup or hold time failures thereby tends to center the functional sample point for the data, while the combination of incrementing and decrementing the guardband delay values in response to the occurrence or lack of occurrence of double guardband fails will cause the early and late sample points to be close to the edges of the data eye. This combination of feedback mechanisms thereby tracks the edges of the data eye and centers the functional data within that data eye.

Note that the pass counter is used essentially as a "hysteresis" mechanism, allowing the guardband to "grow" quickly whenever any double guardband fails occur, but causing the guardband to shrink more slowly, thereby keeping the guardband checking logic checking for wider guardbands longer.

Although the present invention and its advantages have been described in detail, it should be understood that various changes, substitutions and alterations can be made herein without departing from the spirit and scope of the invention as defined by the appended claims.

What is claimed is:

1. An apparatus comprising:
   at least one of:
      a first storage unit operable for sampling a first data stream in response to a first clock; and
      a second storage unit operable for sampling a second data stream in response to a second clock, wherein said second data stream comprises a delayed data stream derived from said first data stream;
   a third storage unit operable for sampling said first data stream in response to said second clock, wherein said first clock comprises a delayed clock derived from said second clock; and
   at least one of:
      a first comparison logic operable for receiving sampled data from said first storage unit and sampled data from said third storage unit, an output of said first comparison logic having a first logic state when said sampled data from said first storage unit and sampled data from said third storage unit compare, and a second logic state when said sampled data from said first storage unit and sampled data from said second storage unit miscompare; and
      a second comparison logic operable for receiving sampled data from said second storage unit and sampled data from said third storage unit, an output of said second comparison logic having a first logic state when said sampled data from said second storage unit and sampled data from said third storage unit compare, and a second logic state when sampled data from said second storage unit and sampled data from said third storage unit miscompare.

2. The apparatus of claim 1 wherein, when said apparatus includes said first storage unit, a delay of said first clock comprises a selectably adjustable delay, said delay of said first clock being adjustable in a first direction in response to said output of said first comparison logic having said second logic state and adjustable in a second direction in response to said output of said first comparison logic having said first logic state, and wherein, when said apparatus includes said second storage unit, a delay of said second data stream comprises a selectably adjustable delay, said delay of said second data stream being adjustable in a first direction in response to said output of said second comparison logic having said second logic state and adjustable in a second direction in response to said output of said second comparison logic having said first logic state.

3. The apparatus of claim 2 wherein said first direction comprises a decreased delay and said second direction comprises an increased delay.

4. The apparatus of claim 2 further comprising a state machine operable for sampling at least one of an output of said first comparison logic and said second comparison logic, said state machine operable for adjusting at least one of said delay of said first clock and said second data stream in response to said at least one of said output of said first comparison logic and said second comparison logic.

5. The apparatus of claim 4 wherein said apparatus includes both said first storage unit and said second storage unit, and both said first and second comparison logic, and said state machine is operable for adjusting a delay of at least one of said first clock and said second data stream in response to an output of a corresponding one of said first comparison logic and said second comparison logic.

6. The apparatus of claim 4 further comprising at least one of a first adjustable delay unit operable for delaying said first data stream and outputting said second data stream, and a second adjustable delay unit operable for delaying said second clock and outputting said first clock, wherein a delay of said at least one of said first adjustable delay unit and said second adjustable delay unit is adjusted in response to corresponding outputs of said state machine.

7. The apparatus of claim 4 wherein said state machine samples at preselected time intervals.

8. The apparatus of claim 7 wherein said preselected time intervals comprise a preselected number of cycles of said second clock.

9. The apparatus of claim 5 wherein said state machine is operable for adjusting both the delay of said first clock and said second data stream in response to the first logic state of said output of said first comparison logic and said second comparison logic, and wherein said second direction comprises an increased delay.

10. The apparatus of claim 5 wherein said state machine is operable for adjusting both the delay of said first clock and said second data stream in response to the second logic state of said output of said output of said first comparison logic and said second comparison logic, and wherein said first direction comprises a decreased delay.

11. The apparatus of claim 9 wherein said first logic state persists for a preselected number of samples of said outputs of said first and second comparison logic.

12. The apparatus of claim 1 wherein, when said apparatus includes said first storage unit, a delay of said first clock comprises a selectably adjustable delay, said delay of said first clock being adjustable in a first direction in response to said output of said first comparison logic having said second logic state.

13. The apparatus of claim 12 wherein said delay of said first clock is adjustable in a second direction in response to said output of said first comparison logic having said first logic state.

14. The apparatus of claim 1 wherein, when said apparatus includes said second storage unit, a delay of said second data stream comprises a selectably adjustable delay, said delay of said second data stream being adjustable in a first direction in response to said output of said second comparison logic having said second logic state.

15. The apparatus of claim 14 wherein said delay of said second data stream is adjustable in a second direction in response to said output of said second comparison logic having said first logic state.

16. The apparatus of claim 6 further including a third adjustable delay unit, said third adjustable delay unit operable for outputting said second clock, said second clock having a preselected delay relative to a third clock, wherein said preselected delay relative to said third clock includes a delay selected in response to said sampled output of said first comparison logic having said second logic state and said sampled output of said second comparison logic having said first logic state.

17. The apparatus of claim 6 further including a third adjustable delay unit, said third adjustable delay unit operable for outputting said first data stream, said first data stream having a preselected delay relative to a third data stream, wherein said preselected delay relative to said third data stream includes a delay selected in response to said sampled output of said second comparison logic having said second logic state and said sampled output of said first comparison logic having said first logic state.

18. The apparatus of claim 16 wherein said third adjustable delay unit is adjusted in response to a signal from said state machine.

19. The apparatus of claim 17 wherein said third adjustable delay unit is adjusted in response to a signal from said state machine.

20. The apparatus of claim 5 wherein said delay of said at least one of said first clock and said second data stream comprises a delay of said first clock and a delay of said second data stream, and further comprising logic for receiving said a value of said delay of said first clock and a value of said delay of said second data stream, and outputting a guardband width value.

21. The apparatus of claim 20 wherein said logic for outputting said guardband width value further includes:

logic for comparing said guardband width value with a preselected threshold value; and logic for outputting a flag having a first predetermined logic state when said guardband width value exceeds said preselected threshold value, said flag having a second predetermined logic state when said preselected threshold value exceeds said guardband width value.

22. A phase detector method comprising:

(a) sampling a first data stream in response to a first clock;

(b) sampling a second data stream in response to a second clock, wherein said second data stream comprises a delayed data stream derived from said first data stream;

(c) sampling said first data stream in response to said second clock, wherein said first clock comprises a delayed clock derived from said second clock;

(d) comparing sampled data from step (a) and sampled data from step (c) and outputting a first logic state when said sampled data from step (a) and said sampled data from step (c) compare, and a second logic state when said sampled data from step (a) and said sampled data from step (c) miscompare; and (e) comparing sampled data from step (b) and said sampled data from step (c) and outputting a first logic state when said sampled data from step (b) and said sampled data from step (c) compare, and a second logic state when said sampled data from step (b) and said sampled data from step (c) miscompare.

23. The method of claim 22 further comprising:

(f) decreasing a delay of said first clock when said output from step (d) has said second logic state, and increasing a delay of said first clock when said output from step (d) has said first logic state; and (g) decreasing a delay of said second data stream when said output from step (e) has said second logic state, and increasing a delay of said second data stream when output from step (e) has said first logic state.

24. The method of claim 23 further comprising:

(h) generating a measure of a guardband width derived from a difference of said delay of said first clock and said delay of said second data stream.

25. The method of claim 24 further comprising:

(i) asserting a data valid flag when said measure of said guardband width exceeds a preselected threshold.

* * * * *

UNITED STATES PATENT AND TRADEMARK OFFICE
CERTIFICATE OF CORRECTION

PATENT NO. : 6,762,626 B1
DATED : July 13, 2004
INVENTOR(S) : Daniel Mark Dreps et al.

It is certified that error appears in the above-identified patent and that said Letters Patent is hereby corrected as shown below:

Column 5,
Line 66, please replace "flips flops" with -- flip flops --.

Signed and Sealed this

First Day of February, 2005

JON W. DUDAS
*Director of the United States Patent and Trademark Office*